United States Patent
Chang et al.

(10) Patent No.: US 11,482,518 B2
(45) Date of Patent: Oct. 25, 2022

(54) SEMICONDUCTOR STRUCTURES HAVING WELLS WITH PROTRUDING SECTIONS FOR PICKUP CELLS

(71) Applicant: Taiwan Semiconductor Manufacturing Co., Ltd., Hsinchu (TW)

(72) Inventors: Yung Feng Chang, Hsinchu (TW); Chun-Chia Hsu, Hsinchu (TW); Tung-Heng Hsieh, Hsinchu County (TW); Bao-Ru Young, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 4 days.

(21) Appl. No.: 17/213,979

(22) Filed: Mar. 26, 2021

(65) Prior Publication Data

US 2022/0310583 A1    Sep. 29, 2022

(51) Int. Cl.
*H01L 27/02* (2006.01)
*H01L 27/092* (2006.01)
*H01L 29/08* (2006.01)

(52) U.S. Cl.
CPC ...... *H01L 27/0207* (2013.01); *H01L 27/0924* (2013.01); *H01L 29/0847* (2013.01)

(58) Field of Classification Search
CPC ............. H01L 27/0207; H01L 27/0924; H01L 29/0847
See application file for complete search history.

(56) References Cited

U.S. PATENT DOCUMENTS 5,143,866 A    9/1992   Matsutani
6,768,144 B2   7/2004   Houston et al.
(Continued)

FOREIGN PATENT DOCUMENTS

EP    0023429    12/1985

OTHER PUBLICATIONS

Intel, AN 766: Intel® Stratix® 10 Devices, High Speed Signal Interface Layout Design Guideline, Mar. 12, 2019, 87 pages.
(Continued)

*Primary Examiner* — Karen Kusumakar
*Assistant Examiner* — Adam S Bowen
(74) *Attorney, Agent, or Firm* — Haynes and Boone, LLP

(57) ABSTRACT

A semiconductor structure includes a substrate having first and second wells of first and second conductivity types respectively. From a top view, the first and second wells extend lengthwise along a first direction, the first and second wells each includes a protruding section that protrudes along a second direction perpendicular to the first direction and a recessed section that recedes along the second direction. The protruding section of the first well fits into the recessed section of the second well, and vice versa. The semiconductor structure further includes first source/drain features over the protruding section of the first well; second source/drain features over the second well; third source/drain features over the protruding section of the second well; and fourth source/drain features over the first well. The first and second source/drain features are of the first conductivity type. The third and fourth source/drain features are of the second conductivity type.

20 Claims, 12 Drawing Sheets

(56) References Cited

U.S. PATENT DOCUMENTS

| | | |
|---|---|---|
| 7,586,147 B2 | 9/2009 | Liaw |
| 8,310,860 B1 | 11/2012 | Houston |
| 8,693,235 B2 | 4/2014 | Liaw |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,980,763 B2 | 3/2015 | Wang et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,607,685 B2 | 3/2017 | Liaw |
| 9,625,824 B2 | 4/2017 | Lu et al. |
| 9,627,379 B1 | 4/2017 | Chang et al. |
| 9,646,973 B2 | 5/2017 | Liaw |
| 9,691,471 B2 | 6/2017 | Liaw |
| 10,050,045 B1 | 8/2018 | Hsu et al. |
| 10,314,154 B1 | 6/2019 | Hsu et al. |
| 10,460,794 B1* | 10/2019 | Liaw .................. H01L 27/1104 |
| 2008/0116400 A1 | 5/2008 | Schmidt et al. |
| 2013/0063803 A1 | 3/2013 | Delgado et al. |
| 2014/0153321 A1 | 6/2014 | Liaw |
| 2014/0252477 A1* | 9/2014 | Tseng ................ H01L 29/66795 |
| | | 438/151 |
| 2016/0049410 A1 | 2/2016 | Seshadri et al. |
| 2016/0372182 A1 | 12/2016 | Liaw |
| 2017/0110454 A1 | 4/2017 | Chang et al. |
| 2017/0125411 A1 | 5/2017 | Yu et al. |
| 2019/0067277 A1 | 2/2019 | Tsai et al. |
| 2019/0103472 A1 | 4/2019 | Cheng et al. |
| 2019/0326287 A1* | 10/2019 | Liaw .................. H01L 29/6681 |
| 2020/0098766 A1 | 3/2020 | Liaw |
| 2020/0168616 A1 | 5/2020 | Yang et al. |
| 2020/0251476 A1 | 8/2020 | Chang et al. |
| 2020/0395476 A1 | 12/2020 | Su et al. |

OTHER PUBLICATIONS

Vladimír Stejskal, Jiří Slezák, on Semiconductor®, LOD Effect: Modeling and Implementation, Mar. 8, 2016, 20 pages.

\* cited by examiner

SEMICONDUCTOR STRUCTURES HAVING WELLS WITH PROTRUDING SECTIONS FOR PICKUP CELLS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, in standard cell designs, pickup cells (or strap cells or tap cells) are frequently utilized, for example, for biasing the underlying wells. Pickup cells are typically mixed with regular cells (such as standard cells that perform logic functions) at a certain ratio, for example, one pickup cell every 30 μm length of the regular cells. It is desirable to make the pickup cells smaller so that further device integration can be realized.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
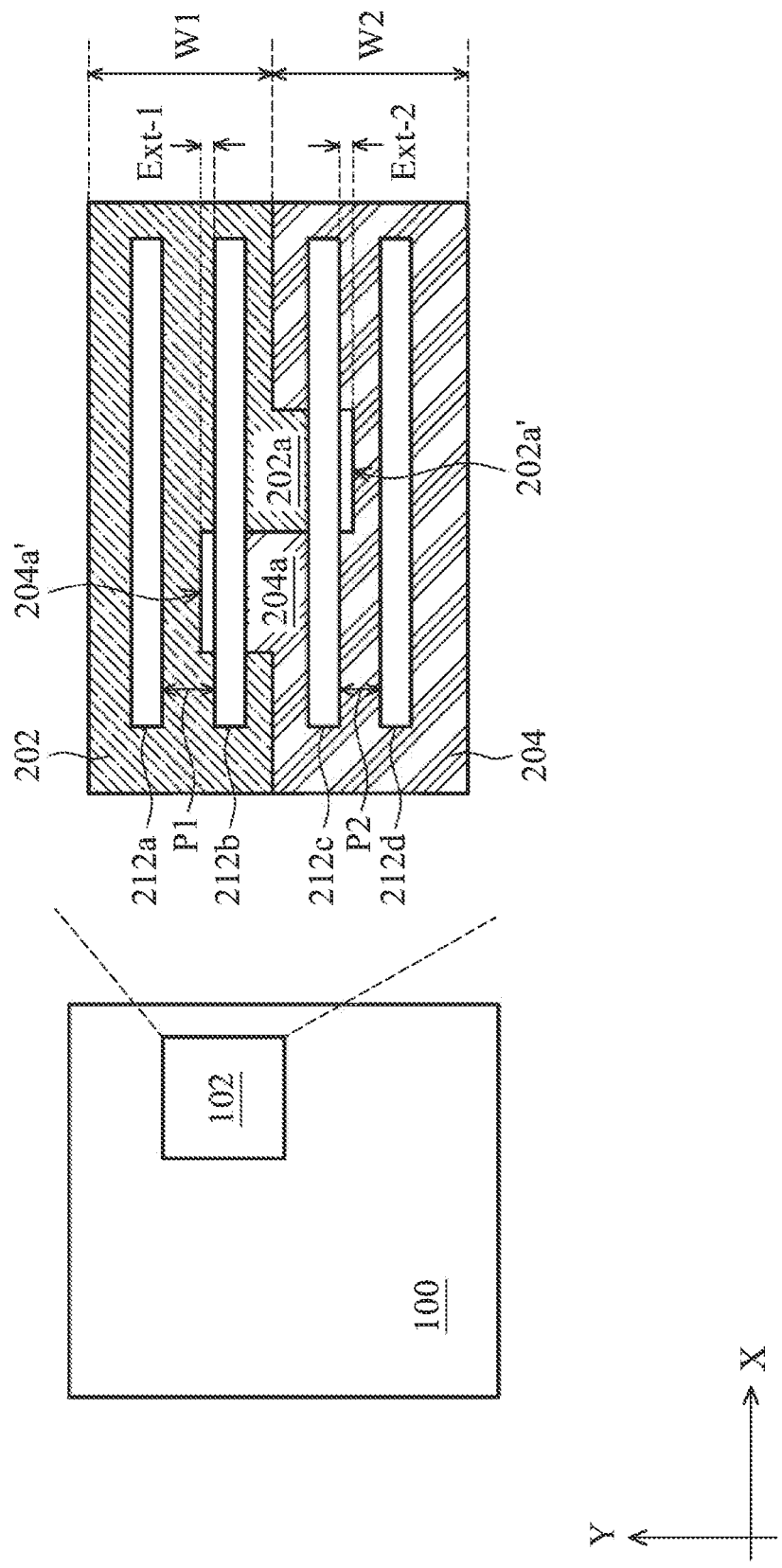
FIG. 1 is a simplified block diagram of an integrated circuit (IC) with a design block having regular cells and pickup cells, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor structures, and more particularly to semiconductor structures and layout designs having both pickup cells and regular cells. In an embodiment, a regular cell is a standard cell such as AND, OR, NOR, INVERTER, or D flip-flop cells. In another embodiment, a regular cell may store memory bits or states. A regular cell includes one or more transistors that are disposed over one or more wells (e.g., doped regions in a silicon wafer). For at least some of the wells, pickup cells are disposed over them so that the wells can be properly biased and/or tested. N-type wells (or N wells) and P-type wells (P wells) have separate pickup cells. Package pins or pads may be connected to the pickup cells in a final IC for providing bias voltages to the wells. Also, tester pins may contact the pickup cells to provide voltages to the wells during manufacturing testing.

In fin-based designs such as FinFET ("FET" stands for field effect transistor), nanosheet FETs, and nanowire FETs, both regular cells and pickup cells are fabricated in and around semiconductor fins. The semiconductor fins are isolated from each other with some oxide-based isolation structure, such as shallow trench isolation (STI). It has been observed that such isolation structure exerts a compressive mechanical stress in the semiconductor fins, creating a so-called LOD effect. The LOD effect is sometimes referred to as Length of Oxide Definition effect or Length Of Diffusion effect. Due to the LOD effect, transistors closer to the diffusion-isolation edge ("edge transistor") suffer from poorer performances than transistors further away from the diffusion-isolation edge ("center transistors"). Generally, edge transistors are treated as dummy transistors and not used for circuit functions.

In some approaches, a first fin for pickup cells and a second fin for regular cells over the same well are physically separated from each other, and source/drain features of opposite conductivity types are formed on the first and the second fins for the pickup cells and the regular cells, respectively. The spacing between the first and the second fins is made large enough to provide design window for fabricating the source/drain features of opposite conductivity types as well as for fin isolation purposes. Further, the end portions of the second fin are excluded for circuit functions due to the LOD effect discussed above. In these approaches, both the spacing between the fins and the exclusion of the end portions of the second fin unavoidably decrease the utilization rate of a silicon wafer. An object of the present disclosure is to overcome the above issues.

In an embodiment of the present disclosure, an N well and a P well are each formed to have a protruding section (or jog-out section) and a recessed section in addition to a main section. The protruding section of the N well fits into the recessed section of the P well, and the protruding section of the P well fits into the recessed section of the N well. Fins on the N well and the P well are continuous. Particularly, a fin runs continuously on the N well and the protruding section of the P well, and another fin runs continuously on the P well and the protruding section of the N well. Pickup cells are fabricated on the portions of the fins on the protruding sections of the wells. Regular cells are fabricated on the portions of the fins on the main sections of the wells. By this design, fins are no longer broken for fabricating pickup cells. This overcomes the issues discussed above. This and other aspects of the present disclosure are further discussed by referring to FIGS. 1-12.

FIG. 1 shows a simplified block diagram of a semiconductor device 100 with a functional block 102, according to various aspects of the present disclosure. The semiconductor device 100 can be, e.g., a microprocessor, an application specific integrated circuit (ASIC), a field programmable gate array (FPGA), or a digital signal processor (DSP). The exact functionality of the semiconductor device 100 is not a limitation to the provided subject matter. The functional block 102 may include standard cells, memory cells, dummy cells, and/or pickup cells. Each of the cells may be implemented with various PMOS and NMOS transistors such as planar transistors, FinFET, gate-all-around (GAA) nanosheet transistors, GAA nanowire transistors, or other types of transistors. Further, the functional block 102 may include various contact features (or contacts), vias, and metal lines for connecting the source, drain, and gate electrodes (or terminals) of the transistors to form an integrated circuit.

FIG. 1 also shows a top view (such as a layout) of a portion of the functional block 102. In the present embodiment, the functional block 102 includes a well 202 and a well 204 oriented lengthwise along the X direction and arranged side-by-side along the Y direction that is perpendicular to the X direction. The wells 202 and 204 are doped with opposite types of dopant, thus having opposite conductivity types. In the present embodiment, the well 202 is a P well and the well 204 is an N well. In an alternative embodiment, the well 202 is an N well and the well 204 is a P well. An N well is doped with n-type dopants, such as phosphorus, arsenic, other n-type dopant, or combinations thereof. A P well is doped with p-type dopants, such as boron, indium, other p-type dopant, or combinations thereof. The functional block 102 further includes various active regions 212 (including the active regions 212a, 212b, 212c, and 212d) oriented lengthwise along the X direction and laid over the wells 202 and 204. In some embodiments, the functional block 102 may include more than 4 active regions 212. As will be discussed later, regular transistors and pickup cells are formed over the active regions 212.

Figure 2:
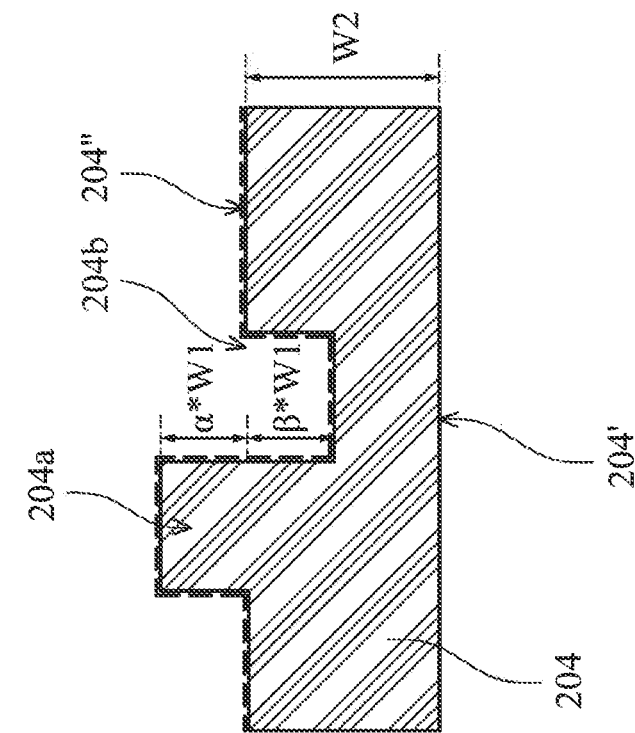
FIG. 2 is a schematic top view, in portion, of two wells with protruding (or jog-out) sections, in accordance with an embodiment.
Figure 2:
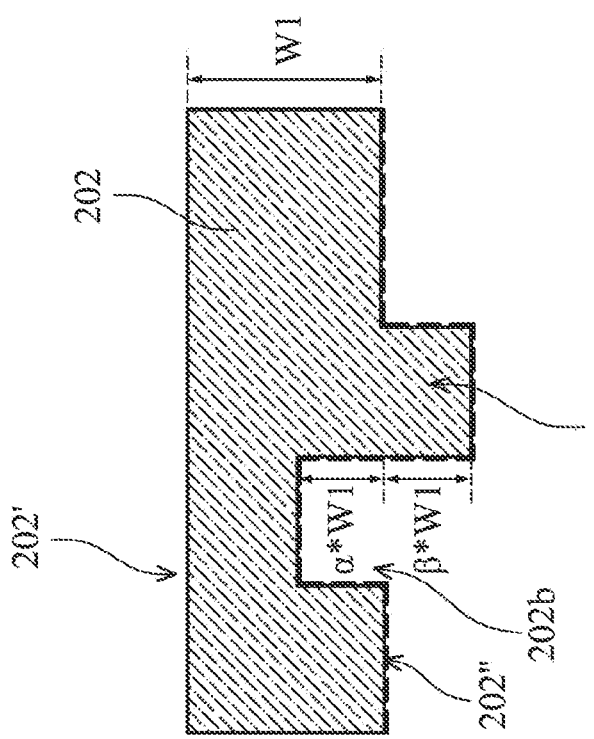

FIG. 2 further illustrates the shape of the wells 202 and 204. Referring to FIG. 2, the well 202 has an edge 202' that is along the X direction and another edge 202" (the dashed line in FIG. 2, left) that is opposite the edge 202'. In the present embodiment, the edge 202' is straight and the edge 202" is jogged (i.e., having multiple turns), creating a recess 202b that recedes into the well 202 along the Y direction and a protruding section (or jog-out section) 202a that protrudes out of the main body of the well 202. In the depicted embodiment, every jog (or turn) on the edge 202" is 90 degrees. It is noted that the jogs (or turns) can be slightly varied from the 90 degrees, such as within +/−5 degrees in various embodiments. Further, when the well 202 is implemented in the semiconductor device 100, the jogs on the edge 202" may be slightly curved, for example, due to optical effects during photolithography. Further, in the present embodiment, the main body of the well 202 has a width W1 along the Y direction, the recess 202b has a depth of $\alpha*W1$ (along the Y direction) where $\alpha$ is a number less than 1, and the protruding section 202a has a width of $\beta*W1$ (along the Y direction) where $\beta$ is a number less than 1. The shape of the well 204 is complementary to that of the well 202. The well 204 has an edge 204' that is along the X direction and another edge 204" (the dashed line in FIG. 2, right) that is opposite the edge 204'. In the present embodiment, the edge 204' is straight and the edge 204" is jogged, creating a recess 204b that recedes into the well 204 along the Y direction and a protruding section (or jog-out section) 204a that protrudes out of the main body of the well 204. In the depicted embodiment, every jog on the edge 204" is 90 degrees. It is noted that the jogs can be slightly varied from the 90 degrees, such as within +/−5 degrees in various embodiments. Further, when the well 204 is implemented in the semiconductor device 100, the jogs on the edge 204" may be slightly curved due to optical effects during photolithography. Further, in the present embodiment, the main body of the well 204 has a width W2 along the Y direction. The width W2 may be the same as the width W1 in some embodiments and may be different from W1 (for example, about $0.9*W1$ to about $1.1*W1$) in alternative embodiments.

The recess 204b has a depth about β*W1 along the Y direction, and the protruding section 204a has a width about α*W1 along the Y direction.

In the present embodiment, the protruding section 204a fits into the recess 202b and the protruding section 202a fits into the recess 204b, such as shown in FIG. 1. The edge of the protruding section 202a is aligned with an edge of the protruding section 204a along the Y direction. The edges 202" and 204" overlap, which is also the boundary between the well 202 and the well 204. In some embodiments, the number α is in a range of about 0.4 to 0.6 such as about 0.45 to about 0.55. As shown in FIG. 1 (and in the further discussion below), the active region 212b overlies the well 204a to form pickup cells for the well 204a. Selecting the value of α in the above range improves process margin when forming the well 204 and the active regions 212. For example, if the value of α is too small (such as less than 0.4), then the distance Ext-1 between the edge 204a' of the well 204 and the edge of the active region 212b might become so small that the pickup cell might not function properly, or it might inadvertently affect the well 202. On the other hand, if the value of α is too large (such as greater than 0.6), then the well 204 and the active region 212a may be so close to each other that the regular transistors formed over the active region 212a might not function properly. Similarly, in some embodiments, the number β is designed in a range of about 0.4 to 0.6 such as about 0.45 to about 0.55 to improve process margin when forming the well 202 and the active regions 212. For example, if the value of β is too small (such as less than 0.4), then the distance Ext-2 between the edge 202a' of the well 202 and the edge of the active region 212c might become so small that the pickup cell might not function properly, or it might inadvertently affect the well 204. On the other hand, if the value of β is too large (such as greater than 0.6), then the well 202 and the active region 212d may be so close to each other that the regular transistors formed over the active region 212d might not function properly. In some embodiments, the values of α and β are about the same. In alternative embodiments, the values of α and β are different but their difference is small, such as within a range of about 10% to 20%, so that the wells 202 and 204 have about the same areas. In various embodiments, the sum of α and β may be in the range of 0.8 to 1.2 to provide sufficient flexibility in the layout of the functional block 102. In some embodiments, each of α and β is about 0.5 and the sum of α and β is about 1.0 so that the distance between the edges 204a' and 202a' to the nearby edges of active regions 212 are provided with equal and sufficient process margin.

Referring again to FIG. 1, the active region 212a is disposed over the well 202 only, the active region 212b is disposed continuously over the well 202 and the protruding section of the well 204 (i.e., the well section 204a), the active region 212c is disposed continuously over the well 204 and the protruding section of the well 202 (i.e., the well section 202a), and the active region 212d is disposed over the well 204 only. The edge 204a' of the protruding section 204a lies between the active regions 212a and 212b and is substantially parallel to the edges of the active regions 212a and 212b. The edge 204a' is spaced away from the edge of the active region 212b by distance Ext-1. The edge 202a' of the protruding section 202a lies between the active regions 212c and 212d and is substantially parallel to the edges of the active regions 212c and 212d. The edge 202a' is spaced away from the edge of the active region 212c by distance Ext-2. The distances Ext-1 and Ext-2 are designed to provide sufficient process margin when forming the wells 202 and 204 and the active regions 212. In some embodiments, the distance Ext-1 is designed to be about 20% to 80% of the space P1 between the active regions 212a and 212b and the distance Ext-2 is designed to be about 20% to 80% of the space P2 between the active regions 212c and 212d. For example, if the distances Ext-1 and Ext-2 are outside of the above range, there is an increased risk that the pickup cells might not function properly, the wells might be erroneously biased, and/or the nearby regular transistors might not function properly. In some embodiments, each of the active regions 212a, 212b, 212c, and 212d is in the form of one or more semiconductor fins. In those embodiments, the active regions 212a, 212b, 212c, and 212d are also referred to as fins 212a, 212b, 212c, and 212d, respectively.

As will be shown later, the portion of the active region 212b over the protruding section 204a is configured for pickup cells for the well 204. Similarly, the portion of the active region 212c over the protruding section 202a is configured for pickup cells for the well 202. The rest of the active regions 212b and 212c as well as the active regions 212a and 212d are configured for regular cells and/or dummy cells. This layout design is more compact than other approaches where active regions for pickup cells are disjoint from active regions for regular and/or dummy cells for at least two reasons. First, the active regions 212b and 212c are continuous through the pickup cells and the regular and/or dummy cells without breakage. This avoids end-to-end spacing between active regions. Second, this layout design reduces the area of active regions that suffer from the LOD effect, which is known to affect devices/cells at the ends of an active region. Therefore, this layout design can effectively produce the same number of functional cells as the other approaches but with less area. In some applications, a reduction of silicon area of about 0.5% to 1% has been observed for standard cell layouts that extend about 30 μm to about 35 μm along the X direction.

Figure 3:
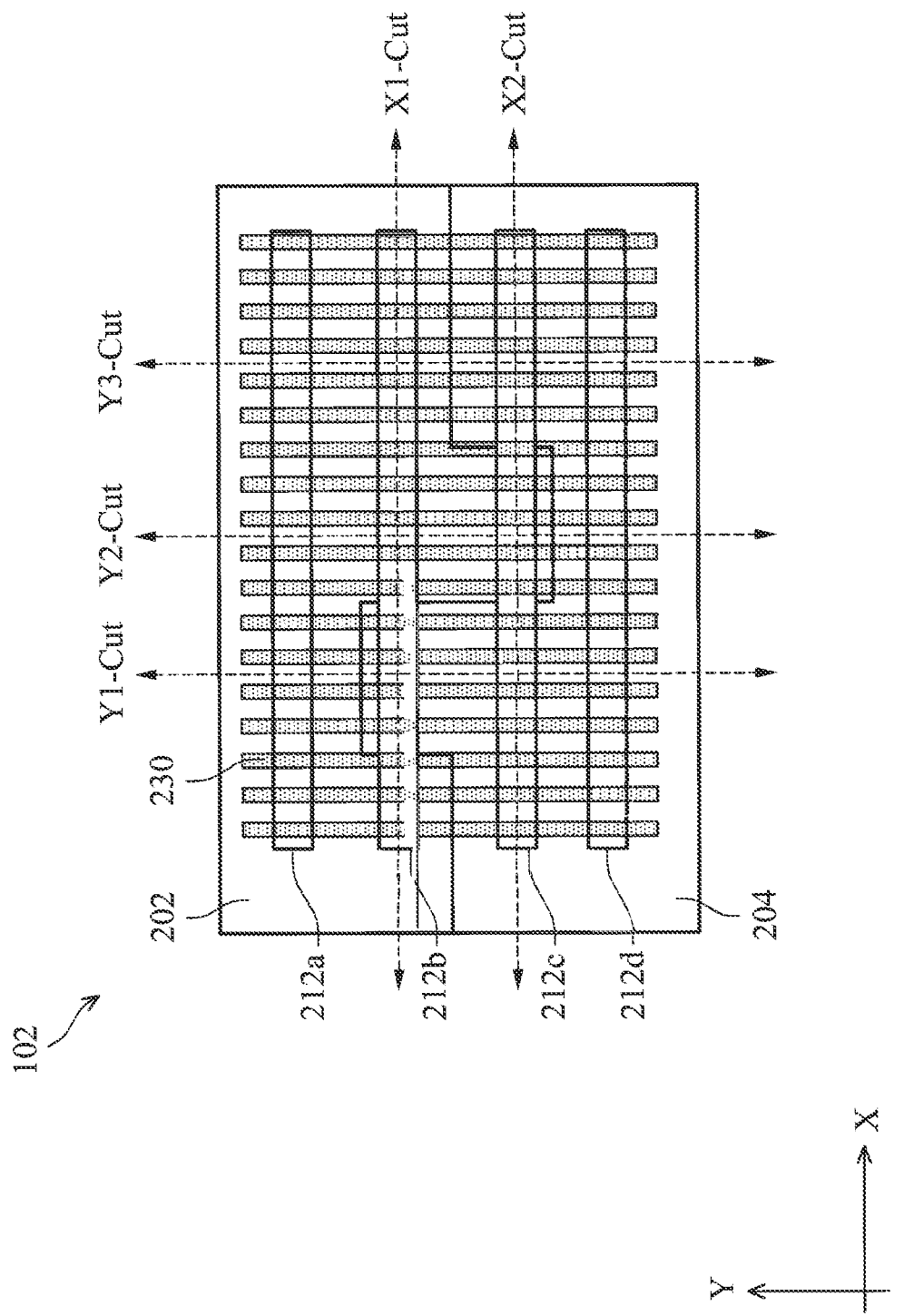
FIG. 3 is a schematic top view, in portion, of the block in FIG. 1, in accordance with an embodiment.

Referring to FIG. 3, the functional block 102 further includes various gate stacks 230 that are oriented lengthwise along the Y direction and are disposed over the active regions 212a through 212d. In an embodiment, each of the gate stacks 230 is a continuous piece in the layout design and may be cut into disjoint pieces during fabrication to form individual gate terminals for transistors. FIGS. 4 through 12 show cross-sectional views of the functional block 102, according to some embodiments, along one of the cut lines (X1-Cut, X2-Cut, Y1-Cut, Y2-Cut, and Y3-Cut) in FIG. 3.

Figure 4:
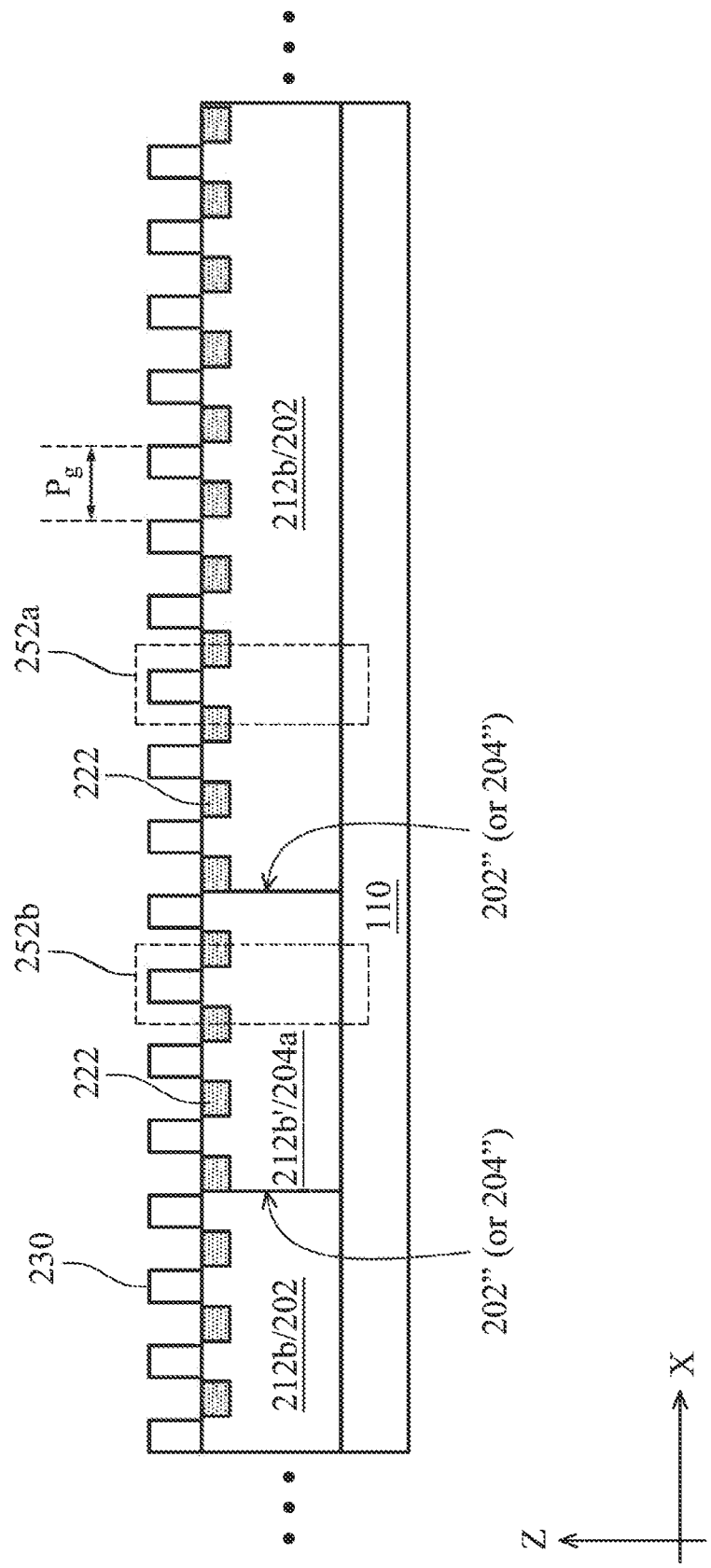
FIG. 4 is a schematic cross-sectional view, in portion, of the block in FIG. 3 along the X1-Cut line of FIG. 3, in accordance with an embodiment.
Figure 5:
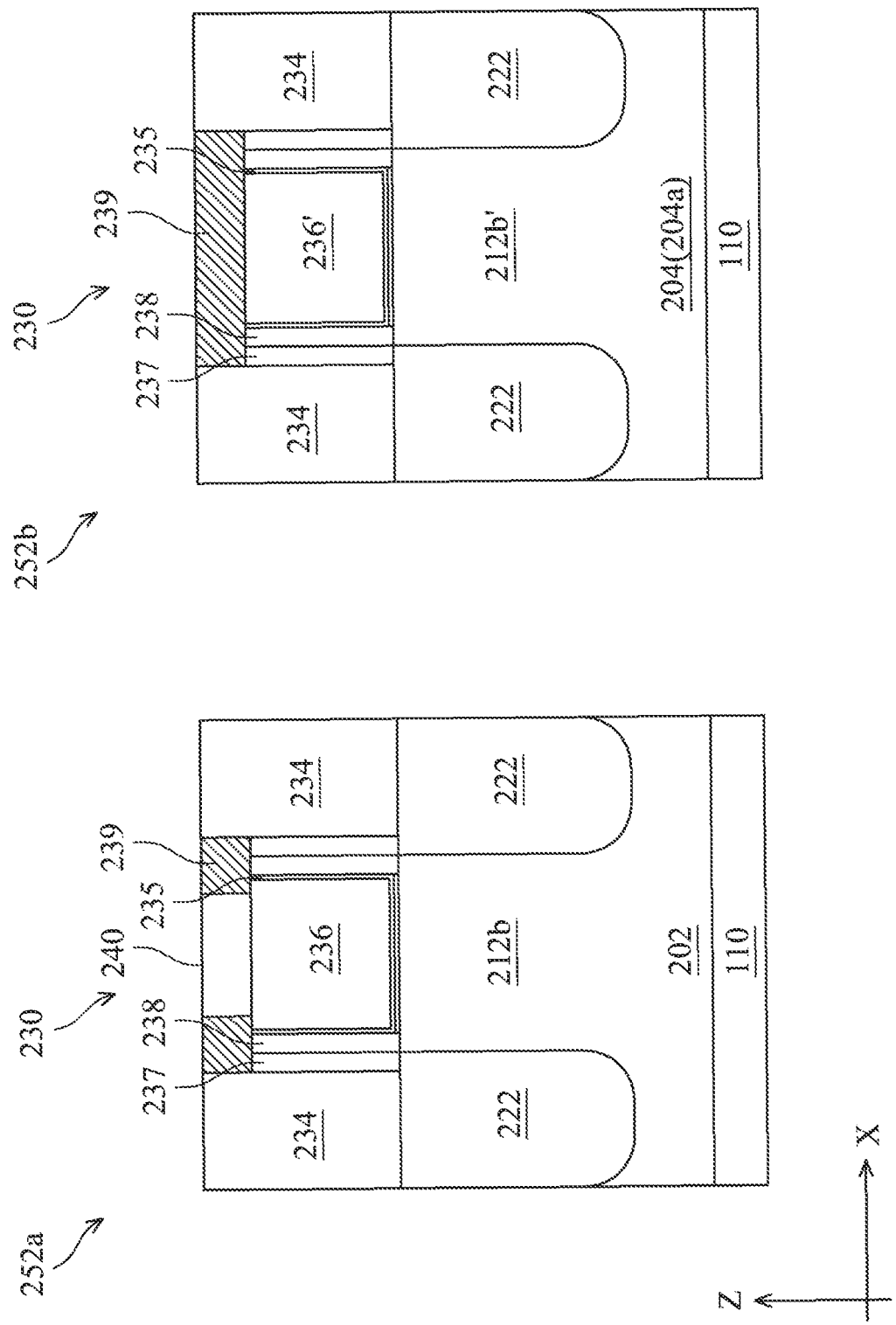
FIG. 5 shows cross-sectional views, in portion, of a standard cell and a pickup cell along the X1-Cut line of FIG. 3, in accordance with an embodiment.

FIG. 4 shows a cross-sectional view of an embodiment of the functional block 102 along the X1-Cut line in FIG. 3, which is cut lengthwise along the active region 212b. FIG. 5 shows a more detailed cross-sectional view of a transistor 252a and a pickup cell 252b according to an embodiment.

Referring to FIGS. 4 and 5 collectively, the functional block 102 includes a substrate 110 where the wells 202 and 204 are created therein or thereon. The active region 212b is in the form of a semiconductor fin in this embodiment. So, it is also referred to as fin 212b. The fin 212b protrudes upwards from the substrate 110 and the wells 202 and 204. For convenience of discussion, the portion of the active region 212b over the protruding well section 204a is designated as active region (or fin) 212b'. The transistor 252a further includes gate spacers 238 on sidewalls of the gate stack 230, source/drain features 222 on both sides of the gate stack 230 and adjacent to the gate spacers 238, source/drain contacts 234, an etch stop layer 237, a dielectric layer 239, and a gate contact 240. The gate stack 230 includes a conductive gate electrode 236 and one or more gate dielectric layers 235. The pickup cell 252b includes the same elements as the transistor 252a except that it does not have a gate contact and its conductive gate electrode is designated as 236'. The elements of the functional block 102 are further described below.

The substrate 110 is a silicon substrate in the present embodiment. For example, it is a silicon wafer or a substrate comprising single crystalline silicon. Alternatively, the substrate 110 may comprise another elementary semiconductor, such as germanium; a compound semiconductor including silicon carbide, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

In an embodiment, the wells 202 and 204 are formed by doping various portions of the substrate 110. For example, P wells may be formed by creating a doping mask using photolithography where the doping mask covers regions of the substrate 110 corresponding to N wells, doping the substrate 110 that is not covered by the doping mask with one or more p-type dopants, and removing the doping mask. The doped regions of the substrate 110 become the P wells. N wells may be formed similarly. In this respect, the doping masks may be created according to the layout shown in FIG. 2.

In the present embodiment, the fins 212 (including fins 212a, 212b, 212c, and 212d) are of the same material as the substrate 110, such as comprising single crystalline silicon. The fins 212 may be patterned by any suitable method. For example, the fins 212 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 212. For example, the masking element may be used for etching recesses into semiconductor layers over or in the substrate 110, leaving the fins 212 on the substrate 110. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 212 may be suitable. Further, in the present embodiment, the fin 212b is doped with the same type of dopant(s) as the well 202, and the fin portion 212b' is doped with the same type of dopant(s) as the well 204.

The source/drain features 222 may be n-type or p-type in various embodiments. In an embodiment, the well 202 is a P well and the well 204 is an N well, the source/drain features 222 are n-type, making the transistor 252a an NMOSFET and the pickup cell 252b an n-type pickup cell (i.e., a pickup cell for an N well). In an alternative embodiment, the well 202 is an N well and the well 204 is a P well, the source/drain features 222 are p-type, making the transistor 252a a PMOSFET and the pickup cell 252b a p-type pickup cell (i.e., a pickup cell for a P well). Further, in the embodiment depicted in FIG. 5, the transistor 252a is a FinFET and the pickup cell 252b is a FinFET pickup cell. In an embodiment, n-type source/drain features 222 may include epitaxially grown silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). In an embodiment, p-type source/drain features 222 may include epitaxially grown silicon germanium or germanium and may be doped with boron, other p-type dopant, or combinations thereof (for example, forming Si:Ge:B epitaxial source/drain features). The source/drain features 222 may be formed by etching trenches into the fins 212, and epitaxially growing semiconductor material(s) in the trenches using CVD deposition techniques (for example, vapor phase epitaxy), molecular beam epitaxy, other suitable epitaxial growth processes, or combinations thereof.

In an embodiment, the gate dielectric layer 235 may include an interfacial layer and a high-k dielectric layer. The interfacial layer may include a dielectric material, such as $SiO_2$, HfSiO, SiON, other silicon-comprising dielectric material, other suitable dielectric material, or combinations thereof. The interfacial layer may be formed by thermal oxidation, chemical oxidation, ALD, CVD, other suitable process, or combinations thereof. The high-k dielectric layer may include a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba,Sr)$TiO_3$ (BST), $Si_3N_4$, hafnium dioxide-alumina ($HfO_2$-$Al_2O_3$) alloy, other suitable high-k dielectric material, or combinations thereof. High-k dielectric material generally refers to dielectric materials having a high dielectric constant, for example, greater than that of silicon oxide ($k\approx3.9$). The high-k dielectric layer may be formed by any of the processes described herein, such as ALD, CVD, PVD, oxidation-based deposition process, other suitable process, or combinations thereof.

In an embodiment, each of the conductive gate electrodes 236 and 236' may include a work function metal layer and a bulk metal layer. In embodiments where the transistor 252a is an NMOSFET, the work function metal layer in the conductive gate electrode 236 provides an n-type work function. In embodiments where the transistor 252a is a PMOSFET, the work function metal layer in the conductive gate electrode 236 provides a p-type work function. On the other hand, the gate electrode 236' is not actually used in the IC 100 (there is no gate contact connecting to the gate electrode 236'). Thus, its work function metal layer can be an n-type work function metal or a p-type work function metal, providing design flexibility. A p-type work function metal layer includes any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. An n-type work function metal layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. The work function metal layer may be formed using a suitable deposition process, such as CVD, PVD, HDPCVD, MOCVD, RPCVD, PECVD, LPCVD, ALCVD, APCVD, plating, other deposition process, or combinations thereof. The bulk metal layer of the gate electrodes 236 and 236' includes a suitable conductive material, such as Co, Al, W, and/or Cu. The bulk metal layer may additionally or collectively include other metals, metal oxides, metal nitrides, other suitable materials, or combinations thereof.

The gate spacers 238 may be formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)).

The etch stop layer 237 may include silicon and nitrogen, such as silicon nitride or silicon oxynitride. The contacts 234 and 240 include a conductive material, such as aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. The dielectric layer 239 may include a dielectric material such as silicon oxide, silicon nitride, silicon oxynitride, TEOS formed oxide, phosphosilicate glass (PSG), low-k dielectric material, other suitable dielectric material, or combinations thereof.

Referring to FIG. 4, some of the transistors 252a and the pickup cells 252b may be close to the boundary 202" (or 204") between the two wells 202 and 204. In some embodiments, those of transistors 252a and the pickup cells 252b that are within 1.5 gate pitch $P_g$ from the boundary 202" and 204" are designated as dummy cells and are not used for either regular circuit functions or well pickup function. This is to account for any overlay shift during mask alignment and photolithography for creating the wells 202 and 204 and for patterning the gate stacks 230.

Figure 6:
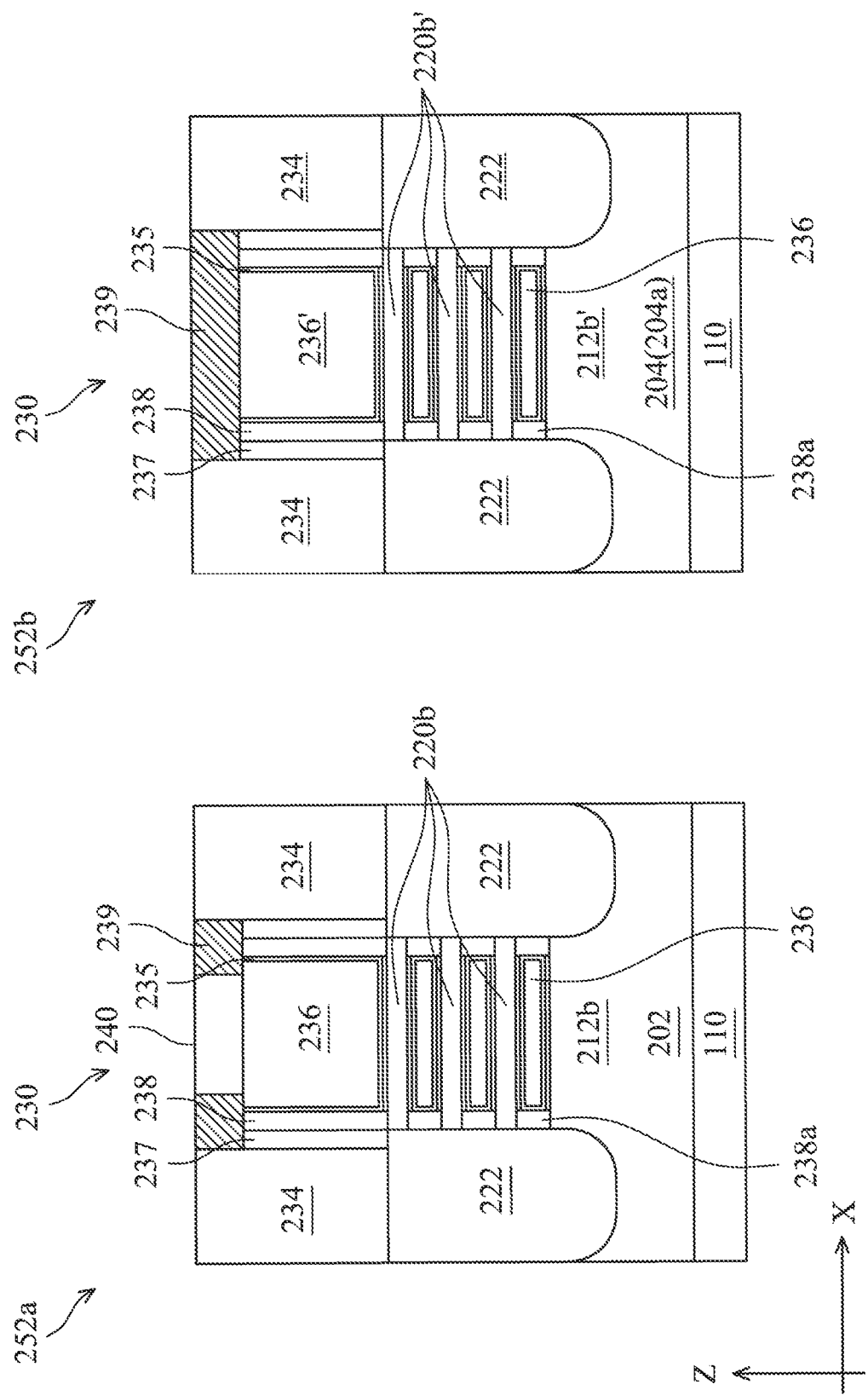
FIG. 6 shows cross-sectional views, in portion, of a standard cell and a pickup cell along the X1-Cut line of FIG. 3, in accordance with another embodiment.

FIG. 6 shows a more detailed cross-sectional view of the transistor 252a and the pickup cell 252b according to an alternative embodiment. In this embodiment, the transistor 252a is a GAA FET (for example, a GAA nanosheet FET or a GAA nanowire FET) and the pickup cell 252b is a GAA pickup cell. The main difference between this embodiment and the one shown in FIG. 5 is in the region between the two source/drain features 222. In the embodiment depicted in FIG. 6, the transistor 252a further includes multiple semiconductor layers 220b connecting the source/drain features 222, and the pickup cell 252b further includes multiple semiconductor layers 220b' connecting the source/drain features 222.

The semiconductor layers 220 and 220' may include silicon, germanium, silicon germanium, or another suitable semiconductor material(s). The semiconductor layers 220 and 220' may be formed using the same process, which is briefly described below using the semiconductor layers 220 as example. Initially, the semiconductor layers 220 are formed as part of a semiconductor layer stack that includes the semiconductor layers 220 and other semiconductor layers of a different material. The semiconductor layer stack is patterned into a shape of a fin using one or more photolithography processes, including double-patterning or multi-patterning processes (e.g., using the same process that forms the fin 212). During a gate replacement process to form the gate stacks 230, the semiconductor layer stack is selectively etched to remove the other semiconductor layers, leaving the semiconductor layers 220 suspended over the substrate 110. As shown in FIG. 6, the gate dielectric layer 235 and the gate electrode layers 236 and 236' are also formed between the semiconductor layers 220 and 220', respectively. Further, an inner spacer 238a is disposed laterally between the source/drain features 222 and the gate stack 230 and vertically between the semiconductor layers 220b and 220b' respectively. The inner spacer 238a may include a dielectric material such as silicon oxide, silicon nitride, silicon oxynitride (SiON), silicon carbide, silicon carbon nitride (SiCN), silicon oxycarbide (SiOC), or silicon oxycarbon nitride (SiOCN).

Figure 7:
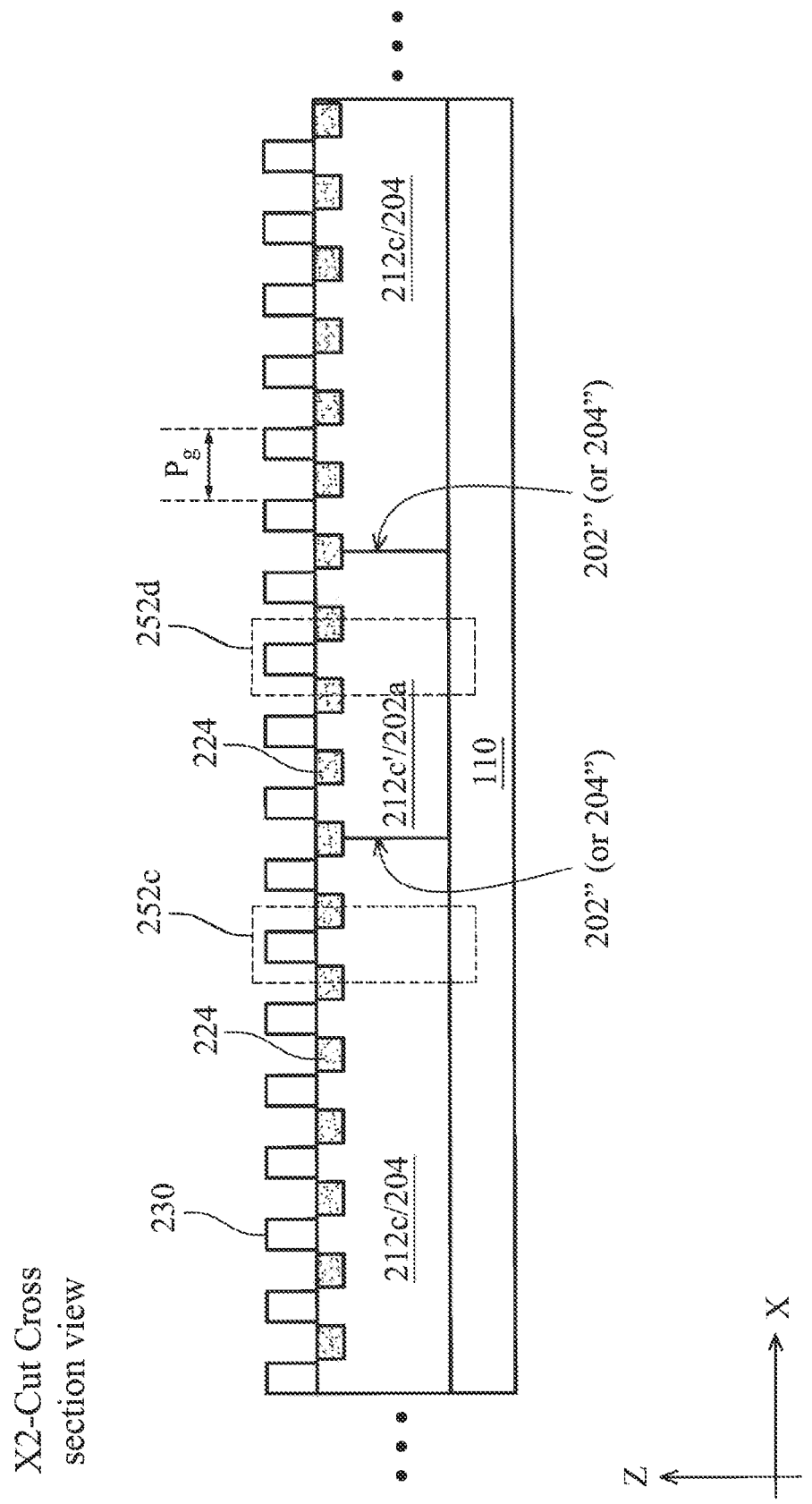
FIG. 7 is a schematic cross-sectional view, in portion, of the block in FIG. 3 along the X2-Cut line of FIG. 3, in accordance with an embodiment.
Figure 8:
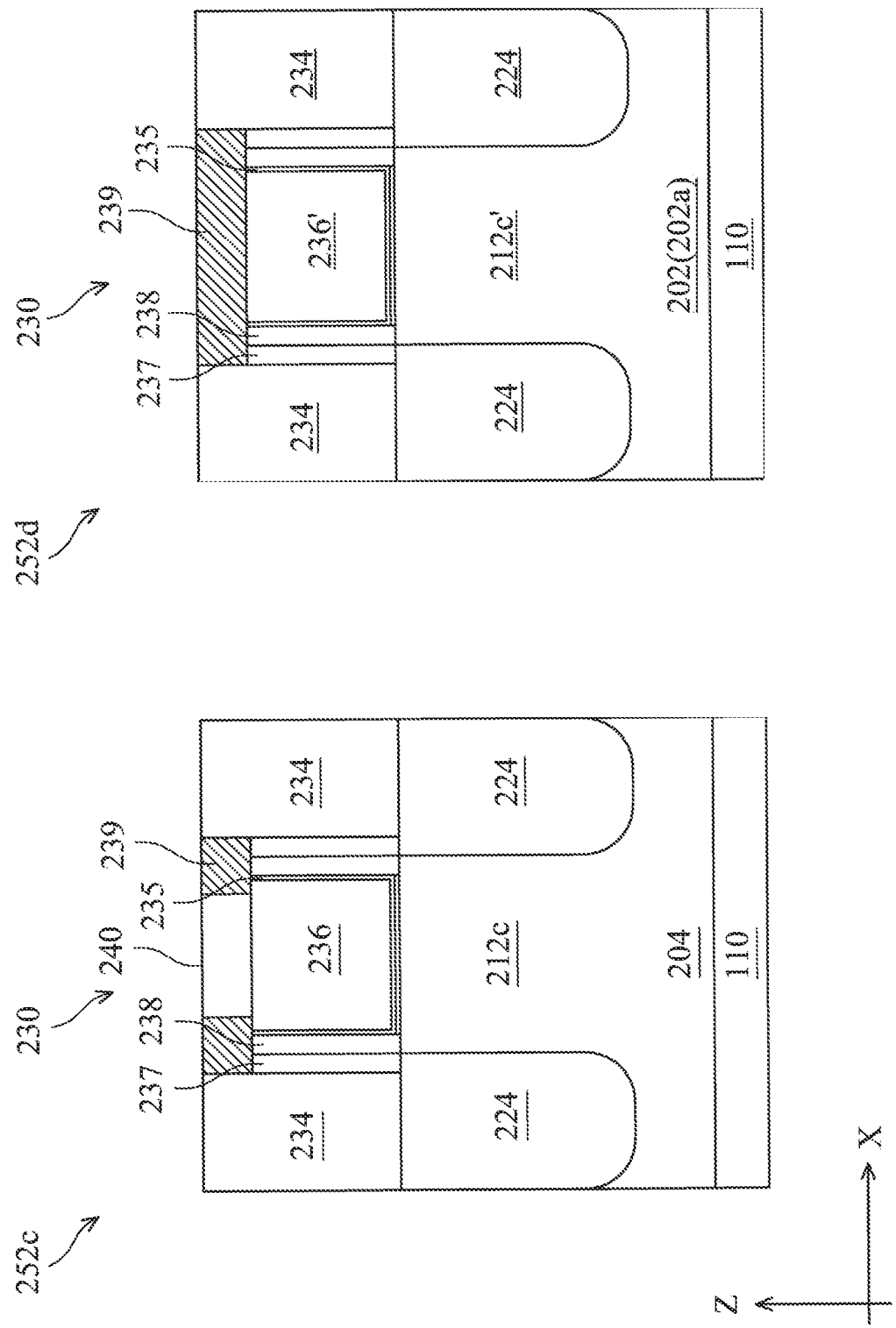
FIG. 8 shows cross-sectional views, in portion, of a standard cell and a pickup cell along the X2-Cut line of FIG. 3, in accordance with an embodiment.
Figure 9:
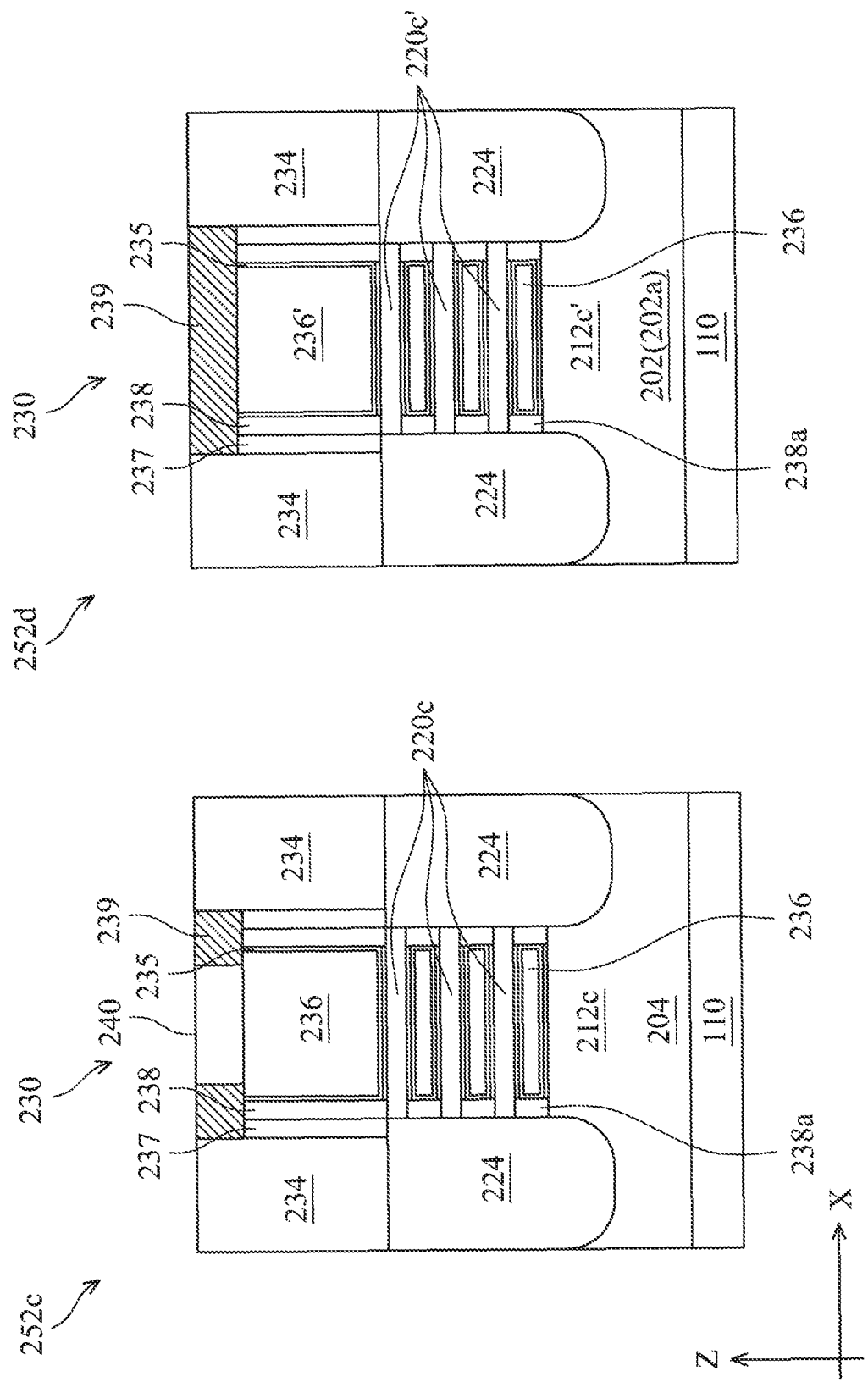
FIG. 9 shows cross-sectional views, in portion, of a standard cell and a pickup cell along the X2-Cut line of FIG. 3, in accordance with another embodiment.

FIG. 7 shows a cross-sectional view of an embodiment of the functional block 102 along the X2-Cut line in FIG. 3, which is cut lengthwise along the active region 212c. FIG. 8 shows a more detailed cross-sectional view of a transistor 252c and a pickup cell 252d according to an embodiment where the transistor 252c is a FinFET and the pickup cell 252d is a FinFET pickup cell. FIG. 9 shows a more detailed cross-sectional view of the transistor 252c and the pickup cell 252d according to an alternative embodiment where the transistor 252c is a GAA FET and the pickup cell 252d is a GAA pickup cell. The features of the transistor 252c and the pickup cell 252d are similar to those of the transistor 252a and the pickup cell 252b, respectively, with like reference numerals denoting like features among the figures. As illustrated in FIGS. 7-9, the fin 212c protrudes upwards from the substrate 110 and the wells 202 and 204. For convenience of discussion, the portion of the fin 212c over the protruding well section 202a is designated as fin 212c'. Further, in the present embodiment, the fin 212c is doped with the same type of dopant(s) as the well 204, and the fin portion 212c' is doped with the same type of dopant(s) as the well 202. Still further, each of the transistor 252c and the pickup cell 252d includes two source/drain features 224. The source/drain features 224 and the source/drain features 222 are of opposite conductivity types. In an embodiment, the source/drain features 222 are of p-type and the source/drain features 224 are of n-type. In an alternative embodiment, the source/drain features 222 are of n-type and the source/drain features 224 are of p-type. Still further, some of the transistors 252c and the pickup cells 252d may be close to the boundary 202" (or 204") between the two wells 202 and 204 (FIG. 7). In some embodiments, those of transistors 252c and the pickup cells 252d that are within 1.5 gate pitch $P_g$ from the boundary 202" and 204" are designated as dummy cells and are not used for either regular circuit function or well pickup function. This is to account for any overlay shift during mask alignment and photolithography for creating the wells 202 and 204 and for patterning the gate stacks 230.

Figure 10:
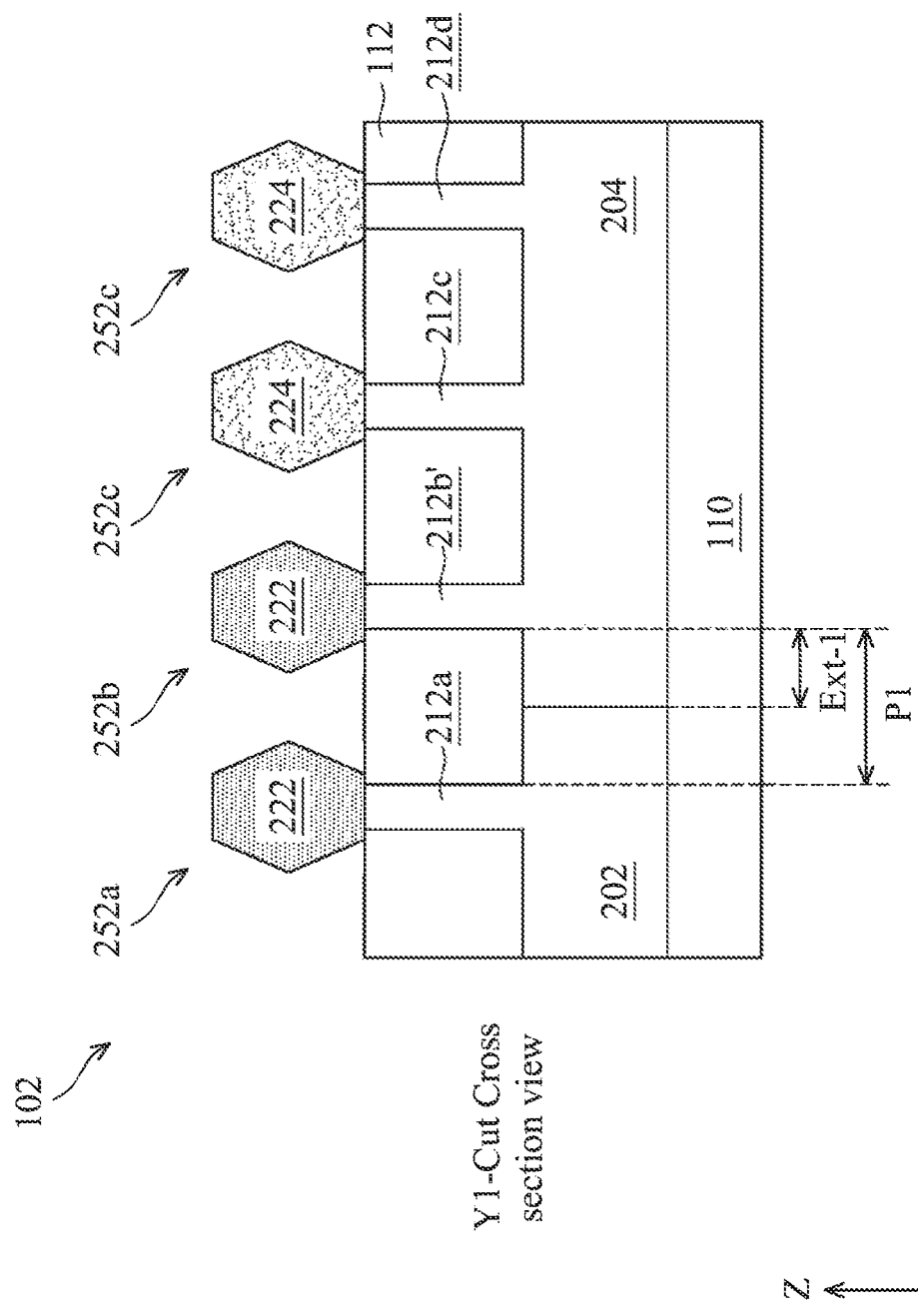
FIGS. 10, 11, and 12 are schematic cross-sectional views, in portion, of the block in FIG. 3 along the Y1-Cut, Y2-Cut, and Y3-Cut lines of FIG. 3 respectively, in accordance with some embodiments.

FIG. 10 shows a cross-sectional view of an embodiment of the functional block 102 along the Y1-Cut line in FIG. 3. As illustrated in FIG. 10, the wells 202 and 204 are created in or on the substrate 110; the fin 212a extend upwards from the substrate 110 and the well 202; the fins 212b', 212c, and 212d extend upwards from the substrate 110 and the well 204; the source/drain features 222 are disposed over the fins 212a and 212b'; and the source/drain features 224 are disposed over the fins 212c and 212d. The functional block 102 further includes an isolation structure 112 that isolates the fins 212. The isolation structure 112 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 112 is a shallow trench isolation (STI) that is formed by etching trenches in or over the substrate 110 (e.g., as part of the process of forming the fins 212), filling the trenches with an insulating material, and performing a chemical mechanical planarization (CMP) process and/or an etching back process to the insulating material, leaving the remaining insulating material as the isolation structure 112. Other types of isolation structure may also be suitable, such as field oxide and LOCal Oxidation of Silicon (LOCOS). The isolation structure 112 may include a multi-layer structure, for example, having one or more liner layers (e.g., silicon nitride) on surfaces of the substrate 110 and the fins 212 and a main isolating layer (e.g., silicon dioxide) over the one or more liner layers. As illustrated in FIG. 10, a portion of the isolation structure 112 is disposed above the boundary between the wells 202 and 204. FIG. 10 further shows the spacing P1 between the fins 212a and 212b' and the distance Ext-1 between the edge of the well 204 and the fin 212b'. As discussed above with reference to FIG. 1, the distance Ext-1 may be in a range of about 20% to 80% of the spacing P1 in some embodiments to provide sufficient process margin.

Figure 11:
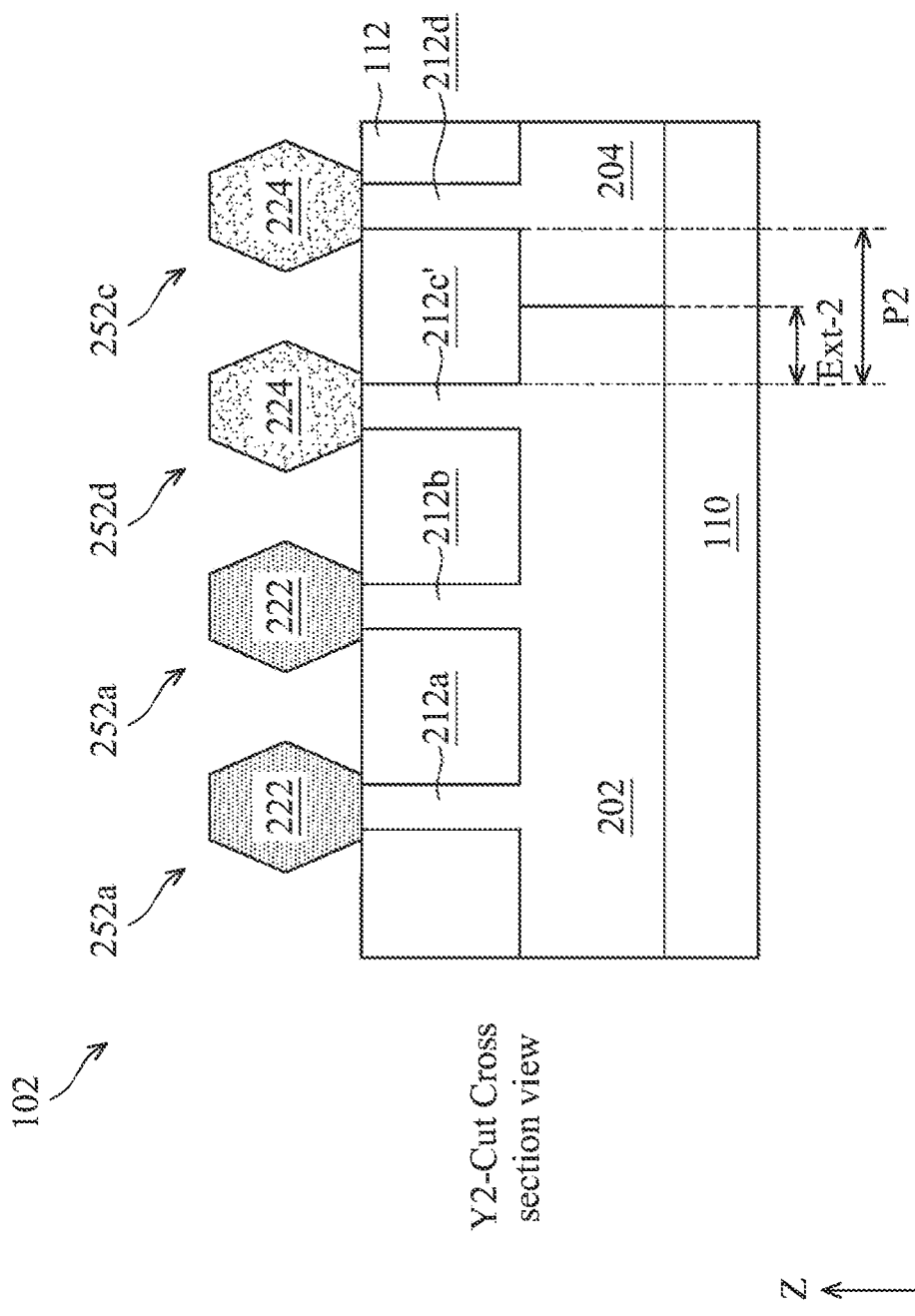
Figure 12:
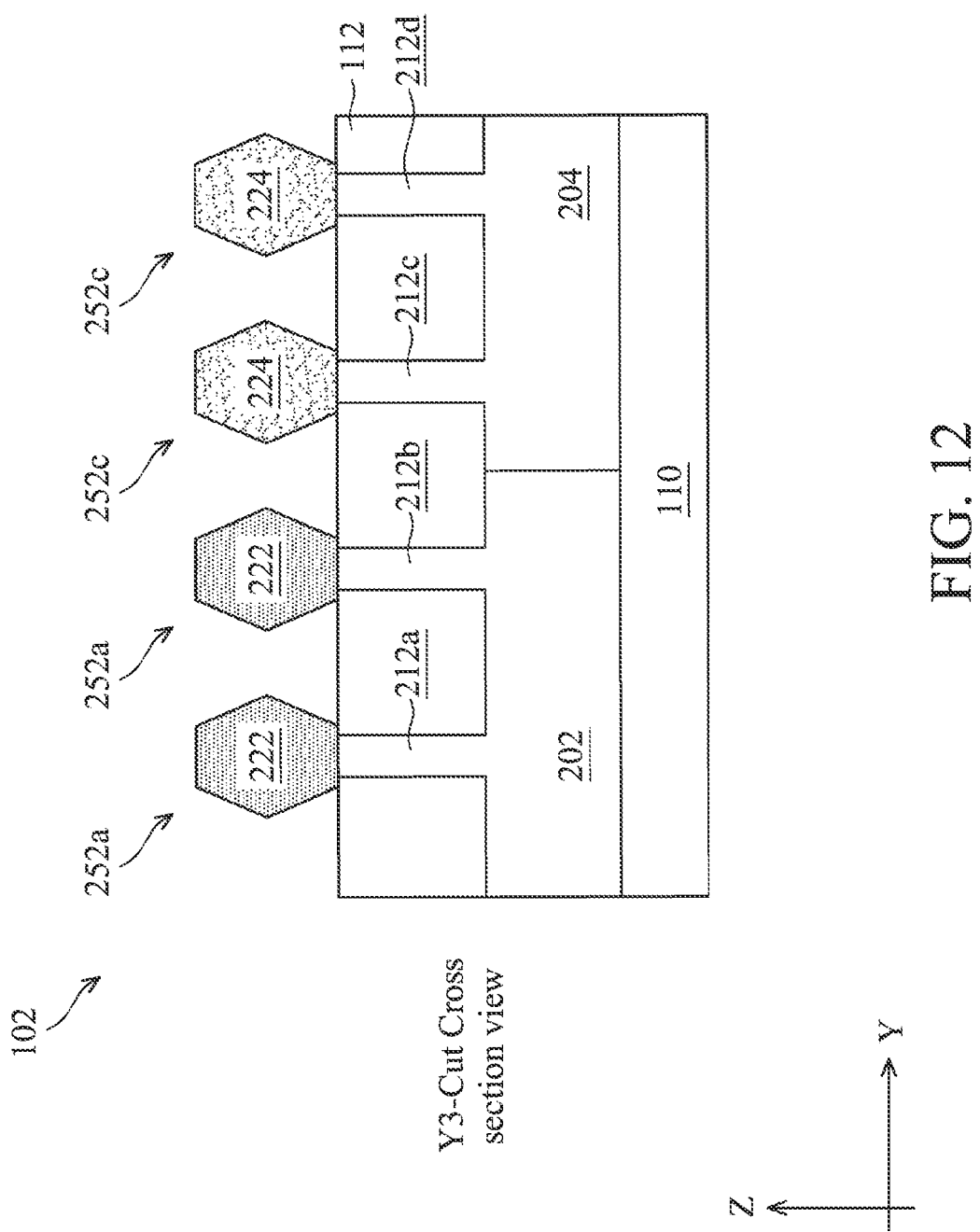

FIG. 11 shows a cross-sectional view of an embodiment of the functional block 102 along the Y2-Cut line in FIG. 3. FIG. 12 shows a cross-sectional view of an embodiment of the functional block 102 along the Y3-Cut line in FIG. 3. Features illustrated in FIGS. 11 and 12 are similar to those illustrated in FIG. 10. Thus, descriptions of FIGS. 11 and 12 are omitted for the sake of brevity. FIG. 11 further shows the spacing P2 between the fins 212c' and 212d and the distance Ext-2 between the edge of the well 202 and the fin 212c'. As discussed above with reference to FIG. 1, the distance Ext-2 may be in a range of about 20% to 80% of the spacing P2 in some embodiments to provide sufficient process margin.

As discussed above, the functional block 102 provide well pickup cells (such as the pickup cells 252b and 252d) for supplying voltages (or biasing) to the N wells and P wells (such as the wells 202 and 204) in the device 100. For a large well, the voltage drop across the well might be significant, which would result in insufficient biasing for some portions of the well unless pickup cells are inserted. In various embodiments, the pickup cells 252b and 252d may be placed in selected areas of the functional block 102 in order to provide sufficient biasing for the wells. For example, the jogged wells 202a and 204a may be repeated once every 30 μm to 35 μm length of the wells 202 and 204 to provide sufficient areas for the pickup cells. Because of the compact design of the present embodiments, the area penalty for introducing the pickup cells is reduced and the device integration is increased.

Although not intended to be limiting, one or more embodiments of the present disclosure provide many benefits to a semiconductor device and the formation thereof. For example, embodiments of the present disclosure provide pickup cells adjacent to regular cells (or transistors), where the pickup cells and the regular cells are formed on a continuous active region (or a continuous fin). This avoids the breakage in the active region design and reduces the impact of LOD effects on the device integration. This effectively shrinks the size of the pickup cells, enabling more compact circuit designs. Embodiments of the present disclosure can be readily integrated into existing semiconductor manufacturing processes.

In one example aspect, the present disclosure is directed to a semiconductor structure that includes a substrate having a first well of a first conductivity type and a second well of a second conductivity type that is opposite of the first conductivity type. From a top view, both the first and the second wells are generally elongated and extend lengthwise along a first direction, each of the first and the second wells includes a protruding section that protrudes generally along a second direction perpendicular to the first direction and a recessed section that recedes generally along the second direction. The protruding section of the first well fits into the recessed section of the second well, and the protruding section of the second well fits into the recessed section of the first well. The semiconductor structure further includes first source/drain features over the protruding section of the first well; second source/drain features over the second well, wherein the first and the second source/drain features are of the first conductivity type and are generally aligned along the first direction; third source/drain features over the protruding section of the second well; and fourth source/drain features over the first well, wherein the third and the fourth source/drain features are of the second conductivity type and are generally aligned along the first direction.

In an embodiment of the semiconductor structure, an edge of the protruding section of the first well is aligned with an edge of the protruding section of the second well along the second direction. In another embodiment, the first conductivity type is n-type, and the second conductivity type is p-type. In yet another embodiment, the first conductivity type is p-type, and the second conductivity type is n-type.

In an embodiment, the semiconductor structure further includes a first semiconductor fin extending upwards from the substrate and extending lengthwise generally along the first direction and continuously over the first well and the protruding section of the second well; and a second semiconductor fin extending upwards from the substrate and extending lengthwise generally along the first direction and continuously over the second well and the protruding section of the first well. The third and the fourth source/drain features are disposed over the first semiconductor fin, and the first and the second source/drain features are disposed over the second semiconductor fin. In a further embodiment, the semiconductor structure further includes an isolation structure laterally between the first and the second semiconductor fins, wherein a boundary between the first and the second wells is below the isolation structure. In another further embodiment, the semiconductor structure further includes a third semiconductor fin extending upwards from the substrate and extending lengthwise generally along the first direction and continuously over the first well, wherein a boundary between the first well and the protruding section of the second well runs generally along the first direction and between the first and the third semiconductor fins. In some embodiments, the semiconductor structure further includes a fourth semiconductor fin extending upwards from the substrate and extending lengthwise generally along the first direction and continuously over the second well, wherein a boundary between the second well and the protruding section of the first well runs generally along the first direction and between the second and the fourth semiconductor fins.

In some embodiments, the semiconductor structure further includes a first gate stack over the substrate and between two of the first source/drain features; a second gate stack over the substrate and between two of the second source/drain features; a third gate stack over the substrate and between two of the third source/drain features; and a fourth gate stack over the substrate and between two of the fourth source/drain features, wherein the first and the fourth gate stacks are aligned generally along the second direction, and the second and the third gate stacks are aligned generally along the second direction.

In another example aspect, the present disclosure is directed to a semiconductor structure. The semiconductor structure includes a substrate having a first well of n-type and a second well of p-type. From a top view, both the first and the second wells are generally elongated and extend lengthwise along a first direction, each of the first and the second wells includes a protruding section that protrudes generally along a second direction perpendicular to the first direction and a recessed section that recedes generally along the second direction. The protruding section of the first well fits into the recessed section of the second well, and the protruding section of the second well fits into the recessed section of the first well. The semiconductor structure further includes a first semiconductor fin extending upwards from the substrate and extending lengthwise generally along the first direction and continuously over the first well and the protruding section of the second well; and a second semiconductor fin extending upwards from the substrate and extending lengthwise generally along the first direction and continuously over the second well and the protruding section of the first well.

In an embodiment, the semiconductor structure further includes first source/drain features over a first section of the second semiconductor fin that is over the protruding section of the first well; and second source/drain features over a second section of the second semiconductor fin that is over the second well, wherein the first and the second source/drain features are of n-type. In a further embodiment, the semiconductor structure further includes third source/drain features over a first section of the first semiconductor fin that is over the protruding section of the second well; and fourth source/drain features over a second section of the first semiconductor fin that is over the first well, wherein the third and the fourth source/drain features are of p-type.

In an embodiment of the semiconductor structure, an edge of the protruding section of the first well is aligned with an edge of the protruding section of the second well along the second direction. In some embodiment, the semiconductor structure further includes a third semiconductor fin extending upwards from the substrate and extending lengthwise generally along the first direction and continuously over the first well, wherein a boundary between the first well and the protruding section of the second well runs generally along the first direction and between the first and the third semiconductor fins. In a further embodiment, the semiconductor structure further includes a fourth semiconductor fin extending upwards from the substrate and extending lengthwise generally along the first direction and continuously over the second well, wherein a boundary between the second well and the protruding section of the first well runs generally along the first direction and between the second and the fourth semiconductor fins.

In yet another example aspect, the present disclosure is directed to an integrated circuit (IC) layout that includes a first well of a first conductivity type and a second well adjacent to the first well and forming a boundary with the first well. The second well is of a second conductivity type opposite of the first conductivity type. The first well includes a first section protruding towards the second well and the second well includes a second section protruding towards the first well. The IC layout further includes a first fin extending lengthwise over the first well and the second section of the second well and a second fin extending lengthwise over the second well and the first section of the first well.

In an embodiment of the IC layout, an edge of the first section of the first well is aligned with an edge of the second section of the second well along a widthwise direction of the first fin. In an embodiment, the IC layout further includes a third fin extending lengthwise over the first well and parallel to the first fin, wherein a portion of the boundary between the first and the second wells falls between the first and the third fins. In a further embodiment, the IC layout further includes a fourth fin extending lengthwise over the second well and parallel to the second fin, wherein another portion of the boundary between the first and the second wells falls between the second and the fourth fins. In some embodiments, the IC layout further includes gates extending lengthwise perpendicular to the first and the second fins.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate having a first well of a first conductivity type and a second well of a second conductivity type that is opposite of the first conductivity type, wherein from a top view, both the first and the second wells are generally elongated and extend lengthwise along a first direction, each of the first and the second wells includes a protruding section that protrudes generally along a second direction perpendicular to the first direction and a recessed section that recedes generally along the second direction, wherein the protruding section of the first well fits into the recessed section of the second well, and the protruding section of the second well fits into the recessed section of the first well;
    first source/drain features over the protruding section of the first well;
    second source/drain features over the second well, wherein the first and the second source/drain features are of the first conductivity type and are generally aligned along the first direction;
    third source/drain features over the protruding section of the second well; and
    fourth source/drain features over the first well, wherein the third and the fourth source/drain features are of the second conductivity type and are generally aligned along the first direction.

2. The semiconductor structure of claim 1, wherein an edge of the protruding section of the first well is aligned with an edge of the protruding section of the second well along the second direction.

3. The semiconductor structure of claim 1, wherein the first conductivity type is n-type, and the second conductivity type is p-type.

4. The semiconductor structure of claim 1, wherein the first conductivity type is p-type, and the second conductivity type is n-type.

5. The semiconductor structure of claim 1, further comprising:
    a first semiconductor fin extending upwards from the substrate and extending lengthwise generally along the first direction and continuously over the first well and the protruding section of the second well; and a second semiconductor fin extending upwards from the substrate and extending lengthwise generally along the first direction and continuously over the second well and the protruding section of the first well, wherein the third and the fourth source/drain features are disposed over the first semiconductor fin, and the first and the second source/drain features are disposed over the second semiconductor fin.

6. The semiconductor structure of claim 5, further comprising:
an isolation structure laterally between the first and the second semiconductor fins, wherein a boundary between the first and the second wells is below the isolation structure.

7. The semiconductor structure of claim 5, further comprising:
a third semiconductor fin extending upwards from the substrate and extending lengthwise generally along the first direction and continuously over the first well, wherein a boundary between the first well and the protruding section of the second well runs generally along the first direction and between the first and the third semiconductor fins.

8. The semiconductor structure of claim 7, further comprising:
a fourth semiconductor fin extending upwards from the substrate and extending lengthwise generally along the first direction and continuously over the second well, wherein a boundary between the second well and the protruding section of the first well runs generally along the first direction and between the second and the fourth semiconductor fins.

9. The semiconductor structure of claim 1, further comprising:
a first gate stack over the substrate and between two of the first source/drain features;
a second gate stack over the substrate and between two of the second source/drain features;
a third gate stack over the substrate and between two of the third source/drain features; and
a fourth gate stack over the substrate and between two of the fourth source/drain features, wherein the first and the fourth gate stacks are aligned generally along the second direction, and the second and the third gate stacks are aligned generally along the second direction.

10. A semiconductor structure, comprising:
a substrate having a first well of n-type and a second well of p-type, wherein from a top view, both the first and the second wells are generally elongated and extend lengthwise along a first direction, each of the first and the second wells includes a protruding section that protrudes generally along a second direction perpendicular to the first direction and a recessed section that recedes generally along the second direction, wherein the protruding section of the first well fits into the recessed section of the second well, and the protruding section of the second well fits into the recessed section of the first well;
a first semiconductor fin extending upwards from the substrate and extending lengthwise generally along the first direction and continuously over the first well and the protruding section of the second well; and
a second semiconductor fin extending upwards from the substrate and extending lengthwise generally along the first direction and continuously over the second well and the protruding section of the first well.

11. The semiconductor structure of claim 10, further comprising:
first source/drain features over a first section of the second semiconductor fin that is over the protruding section of the first well; and
second source/drain features over a second section of the second semiconductor fin that is over the second well, wherein the first and the second source/drain features are of n-type.

12. The semiconductor structure of claim 11, further comprising:
third source/drain features over a first section of the first semiconductor fin that is over the protruding section of the second well; and
fourth source/drain features over a second section of the first semiconductor fin that is over the first well, wherein the third and the fourth source/drain features are of p-type.

13. The semiconductor structure of claim 10, wherein an edge of the protruding section of the first well is aligned with an edge of the protruding section of the second well along the second direction.

14. The semiconductor structure of claim 10, further comprising:
a third semiconductor fin extending upwards from the substrate and extending lengthwise generally along the first direction and continuously over the first well, wherein a boundary between the first well and the protruding section of the second well runs generally along the first direction and between the first and the third semiconductor fins.

15. The semiconductor structure of claim 14, further comprising:
a fourth semiconductor fin extending upwards from the substrate and extending lengthwise generally along the first direction and continuously over the second well, wherein a boundary between the second well and the protruding section of the first well runs generally along the first direction and between the second and the fourth semiconductor fins.

16. An integrated circuit (IC) layout, comprising:
a first well of a first conductivity type;
a second well adjacent to the first well and forming a boundary with the first well, wherein the second well is of a second conductivity type opposite of the first conductivity type, wherein the first well includes a first section protruding towards the second well and the second well includes a second section protruding towards the first well;
a first fin extending lengthwise over the first well and the second section of the second well; and
a second fin extending lengthwise over the second well and the first section of the first well.

17. The IC layout of claim 16, wherein an edge of the first section of the first well is aligned with an edge of the second section of the second well along a widthwise direction of the first fin.

18. The IC layout of claim 16, further comprising a third fin extending lengthwise over the first well and parallel to the first fin, wherein a portion of the boundary between the first and the second wells falls between the first and the third fins.

19. The IC layout of claim 18, further comprising a fourth fin extending lengthwise over the second well and parallel to the second fin, wherein another portion of the boundary between the first and the second wells falls between the second and the fourth fins.

20. The IC layout of claim 16, further comprising gates extending lengthwise perpendicular to the first and the second fins.

\* \* \* \* \*